(12) United States Patent
Passlack

(10) Patent No.: US 8,288,798 B2
(45) Date of Patent: Oct. 16, 2012

(54) STEP DOPING IN EXTENSIONS OF III-V FAMILY SEMICONDUCTOR DEVICES

(75) Inventor: Matthias Passlack, Bertem (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/009,036

(22) Filed: Jan. 19, 2011

(65) Prior Publication Data

US 2011/0193134 A1 Aug. 11, 2011

Related U.S. Application Data

(60) Provisional application No. 61/303,009, filed on Feb. 10, 2010.

(51) Int. Cl.
*H01L 21/02* (2006.01)
(52) U.S. Cl. ........ 257/200; 257/190; 257/192; 257/196; 257/201; 257/E21.4; 257/E21.615; 438/142; 438/151; 438/186; 438/188; 438/197
(58) Field of Classification Search .......... 257/190, 257/192, 196, 200, 201, E21.4, E21.615; 438/142, 151, 186, 188, 197
See application file for complete search history.

(56) References Cited

U.S. PATENT DOCUMENTS

2010/0032716 A1 * 2/2010 Sato et al. ............... 257/192

FOREIGN PATENT DOCUMENTS

JP 04313270 * 11/1992

OTHER PUBLICATIONS

Johnny C. Ho et al., "Nanoscale Doping of InAs via Sulfer Monolayers", Applied Physics Letters 95, 072108 (2009), 0003-6951/2009/95(7)/072108/3/$25.00, 072108-1 through 072108-3.

* cited by examiner

*Primary Examiner* — Asok Sarkar
(74) *Attorney, Agent, or Firm* — Haynes and Boone, LLP

(57) ABSTRACT

The present disclosure provides a method of fabricating a semiconductor device. The method includes forming a buffer layer over a substrate, the buffer layer containing a first compound semiconductor that includes elements from one of: III-V families of a periodic table; and II-VI families of the periodic table. The method includes forming a channel layer over the buffer layer. The channel layer contains a second compound semiconductor that includes elements from the III-V families of the periodic table. The method includes forming a gate over the channel layer. The method includes depositing impurities on regions of the channel layer on either side of the gate. The method includes performing an annealing process to activate the impurities in the channel layer.

18 Claims, 16 Drawing Sheets

STEP DOPING IN EXTENSIONS OF III-V FAMILY SEMICONDUCTOR DEVICES

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Some of these ICs include compound semiconductor transistor devices. A compound semiconductor is a compound semiconductor that includes elements from two or more different groups of the periodic table. The compound semiconductor transistor devices contain doped regions or layers. Existing techniques of forming these doped regions may have shortcomings such as limited control of doping depth and/or lack of abruptness of a resulting active doping profile, and excessive resistance.

Therefore, while methods of forming compound semiconductor transistor devices have been generally adequate for their intended purposes in prior art, they have shortcomings for future applications in complementary metal-oxide-semiconductor (CMOS) technology.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
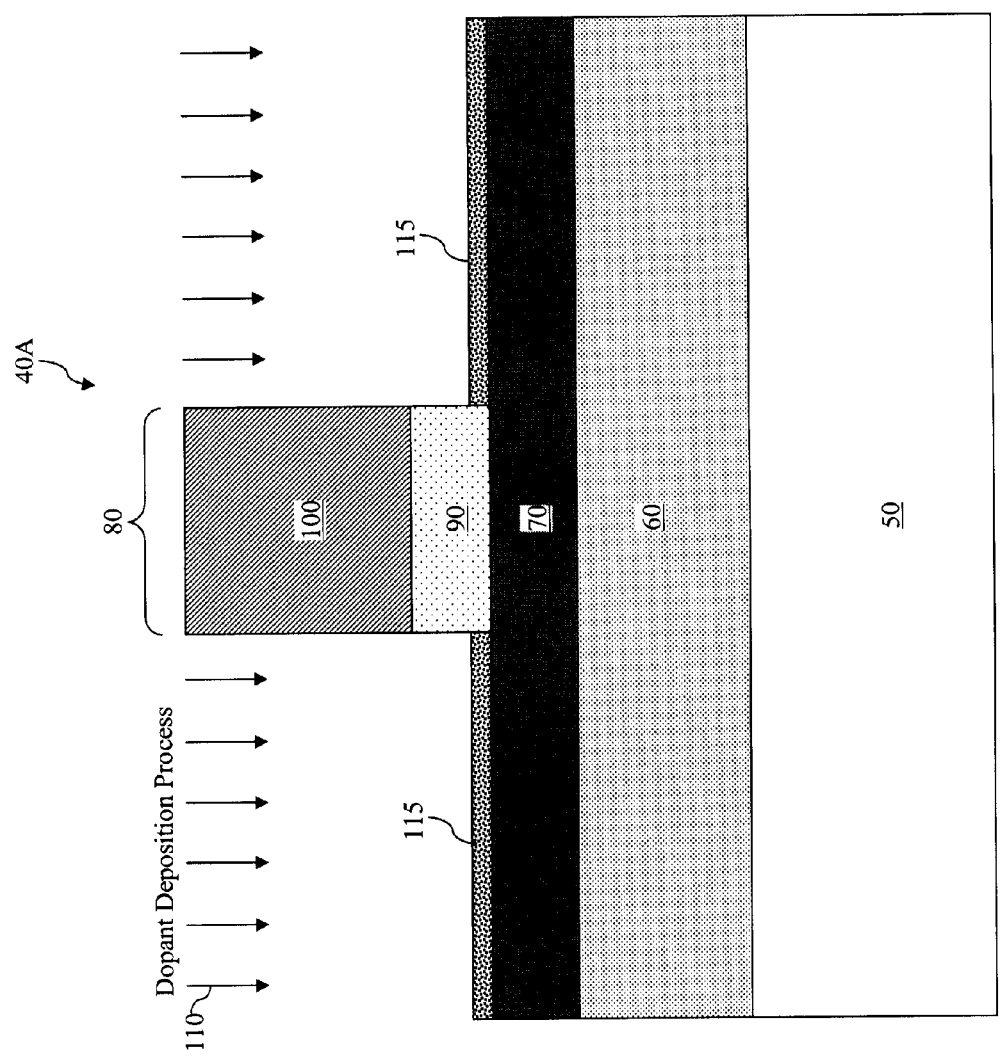
FIGS. 1-3 are diagrammatic fragmentary cross-sectional side views of a portion of a compound semiconductor device fabricated according to an embodiment of the present disclosure.
Figure 2:
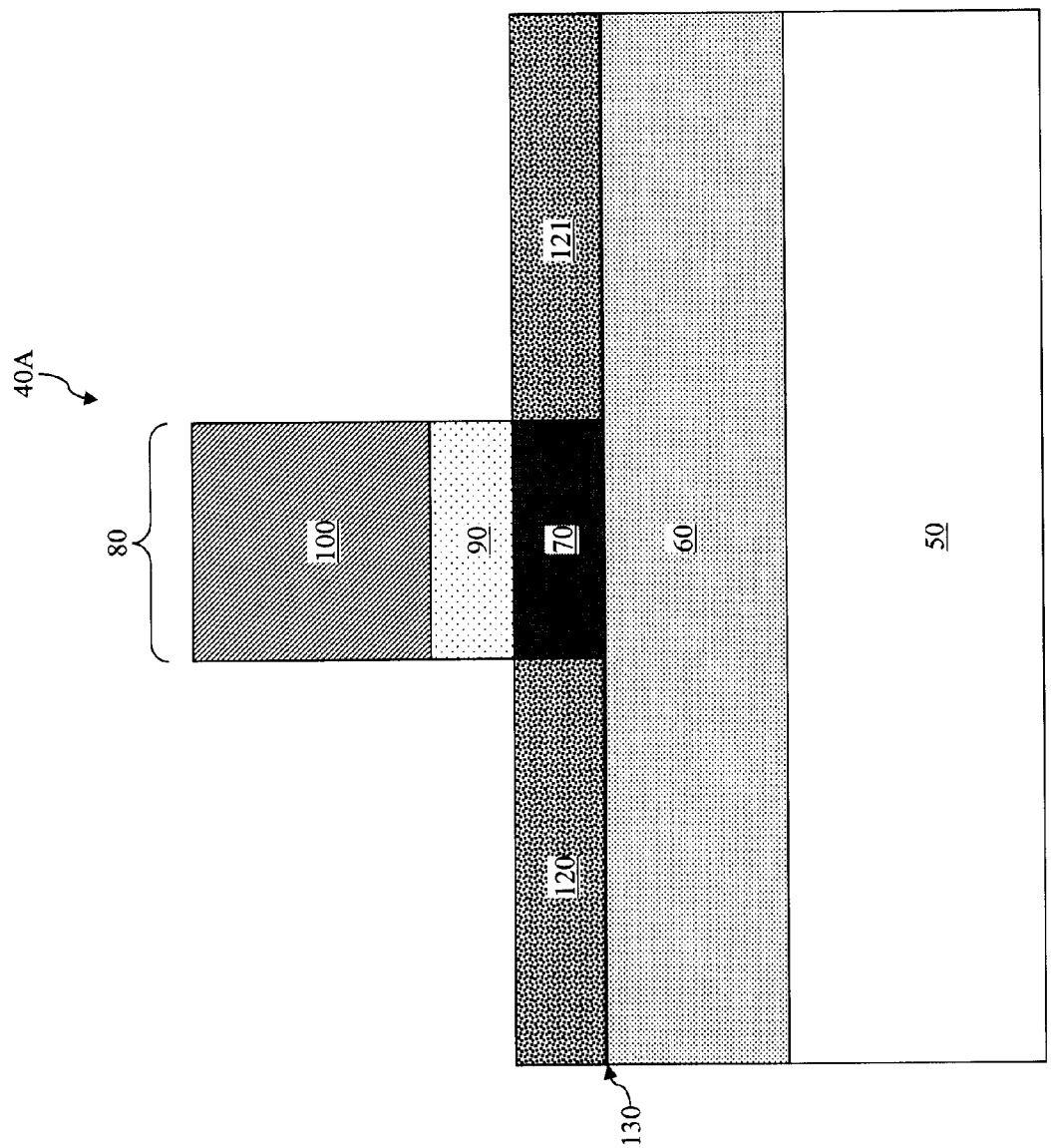
Figure 3:
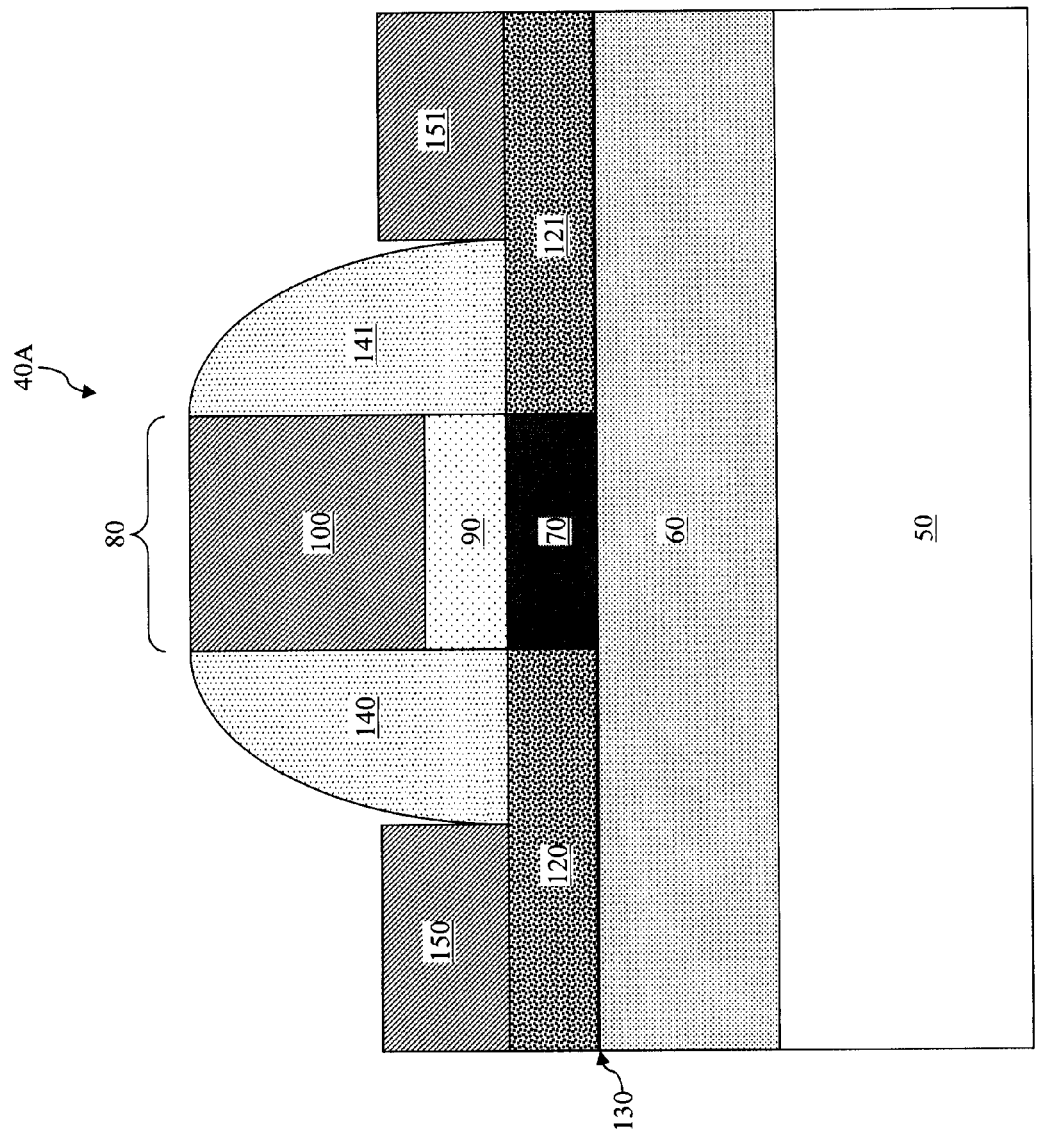

FIGS. 1-3 are diagrammatic fragmentary cross-sectional side views of a portion of a compound semiconductor device 40A fabricated according to an embodiment of the present disclosure. FIGS. 1-3 have been simplified for a better understanding of the inventive concepts of the present disclosure. Referring to FIG. 1, the compound semiconductor device 40A includes a substrate 50. The substrate 50 includes an elemental (e.g. silicon) or compound semiconductor (e.g. GaAs, InAs, GaSb) material.

A buffer layer 60 is formed over the substrate 50. The buffer layer 60 may also be referred to as a barrier layer or an insulator layer. In an embodiment, the buffer layer 60 includes a compound semiconductor material made of elements from the III and V families of the periodic table. For example, the buffer layer 60 may include AlSb, GaSb, AlAsSb, AlGaSb, AlInSb, or InP. In another embodiment, the buffer layer 60 includes a compound semiconductor material made of elements from the II and VI families of the periodic table. For example, the buffer layer 60 may include ZnTe, ZnSe, CdSe, CdS, CdTe, ZnSeTe, CdSeTe, or CdSSe. The buffer layer 60 may be formed by an epitaxial growth process known in the art.

A channel layer 70 is then formed over the buffer layer 60. The channel layer 70 includes a compound semiconductor material made of elements from the III and V families of the periodic table. For example, the channel layer 70 may include InAs, GaSb, InGaAs, InGaSb, or InAsSb. Thus, in one embodiment, the channel layer 70 and the buffer layer 60 contain materials from different columns of the periodic table—the channel layer 70 contains III-V family elements, while the buffer layer 60 contains II-VI family elements. In another embodiment, the channel layer 70 and the buffer layer 60 contain materials from the same columns of the periodic table—both the channel layer 70 and the buffer layer 60 contains III-V family elements. But it is understood that even in the embodiment where both the buffer layer 60 and the channel layer 70 contain elements from the III-V families, the compound makeup or material compositions of the buffer layer 60 and the channel layer 70 are still different. The buffer layer 60 has positive band offsets with respect to the channel layer 70 preferably both in the valence and conduction band but at least in the conduction band for donor type impurities or the valence band for acceptor type impurities.

It is also understood that the buffer layer 60 and the channel layer 70 may have substantially identical lattice constants (lattice matched) according to one embodiment, or that they may have different lattice constants according to alternative embodiments. In these alternative embodiments, the buffer layer 60 and the channel layer 70 may have a lattice mismatch from about 1% to about 10%, for example about 3%. According to one embodiment, the thickness of the channel layer is between 3-10 nm.

A gate structure 80 (also referred to as gate or gate stack) is then formed over the channel layer 70. The gate structure 80 includes a gate dielectric layer 90 and a gate electrode layer 100. In an embodiment, the gate dielectric layer 90 includes a high-k dielectric material. A high-k dielectric material is a material having a dielectric constant that is greater than that of $SiO_2$, which is approximately 4. For example, the high-k dielectric material may include hafnium oxide ($HfO_2$), which has a dielectric constant that is in a range from approximately 18 to approximately 40 A. Alternatively, the high-k material may include one of $ZrO_2$, $Y_2O_3$, $La_2O_5$, $Gd_2O_5$, $TiO_2$, $Ta_2O_5$, $Ga_2O_3$, $Sc_2O_3$, $Al_2O_3$, HfErO, HfLaO, HfYO, HfGdO, HfAlO, HfZrO, HfTiO, HfTaO, SrTiO, or combinations thereof. The gate dielectric layer 90 may be formed by chemical vapor deposition (CVD), physical vapor deposition (PVD), atomic layer deposition (ALD), molecular beam deposition (MBD), combinations thereof, or another suitable deposition technique known in the art.

The gate electrode layer 100 is formed over the gate dielectric layer 90. The gate electrode layer 100 includes a metal material. In an embodiment, the gate electrode layer 100 includes a work function metal portion and a fill metal portion. The work function metal portion has a work function that can be tuned depending on the material composition of the work function metal. The work function is tuned to achieve a desired threshold voltage $V_t$ for the semiconductor device 40A. As examples, the work function metal portion may include materials such as Ti, Al, Ta, $ZrSi_2$, TaN, Mo, Ru, Ir, Pt, W, PtSi, MoN, WNx, or combinations thereof. The fill metal portion of the gate electrode layer 100 serves as the main conductive portion of the gate electrode layer 100, and it may include one of tungsten (W), aluminum (Al), copper (Cu), and combinations thereof. The gate electrode layer 100 may be formed by ALD, PVD, CVD, or other suitable processes.

A dopant deposition process 110 is performed to deposit a dopant layer 115 on the channel layer 70. The dopant layer 115 includes a plurality of impurity atoms. The impurity atoms include a material element selected from the II family, IV family or the VI family of the periodic table. For example, the impurity atoms may include beryllium (Be), carbon (C), silicon (Si), tellurium (Te), selenium (Se), or sulfur (S). The dopant deposition process 110 may be carried out using a CVD process, MBE, electron beam deposition process, thermal evaporation process or sputter process. Due to the presence of the gate structure 80, the only portions of channel layer 70 on which the dopant layer 115 is deposited are portions located on either side of the gate structure 80.

Referring now to FIG. 2, after the dopant deposition process 110 is performed, a thermal annealing process (e.g., rapid thermal annealing) or laser annealing process is performed to diffuse and activate the impurity atoms (the dopant). The thermal annealing process or the laser annealing process may be referred to as a dopant diffusion/activation process.

The dopant deposition process 110 and the subsequent annealing process result in the formation of step-doped regions 120 and 121, which are formed in portions of the channel layer 70 on either side of the gate structure 80. This is at least in part due to the contrast between the dopant activation efficiencies of the channel layer 70 and the buffer layer 60. In more detail, the dopant deposition process 110 and the subsequent annealing process causes impurity atoms to be diffused into portions of the channel layer 70. According to the embodiments where the channel layer 70 and the buffer layer 60 contain compound semiconductor materials from the same columns of the periodic table (i.e., III-V families), the material compositions of the impurity atoms and the channel layer 70 and the buffer layer 60 are selected in a manner such that the channel layer 70 has a very high activation efficiency with respect to the impurity atoms, while the buffer layer 60 has a very low activation efficiency with respect to the impurity atoms. The activation efficiency of the buffer layer 60 with respect to the impurity atoms can be low enough to be considered zero. Consequently, while the impurity atoms are activated in the channel layer 70 during the annealing process, almost no impurity atoms will be activated in the buffer layer 60.

As an example, in one embodiment, the channel layer 70 includes InAs, and the buffer layer 60 includes AlAsSb, and Si is chosen as the impurity to be deposited. Si has a high activation efficiency in InAs (channel layer 70) of up to essentially 100%, but dopant activation efficiency for Si in AlAsSb (buffer layer 60) is close to zero. Therefore, the step-doped regions 120-121 can only be formed in the channel layer 70.

Similarly, in embodiments where the channel layer 70 and the buffer layer 60 contain compound semiconductor materials from different columns of the periodic table (i.e., III-V families for the channel layer 70 and II-VI families for the buffer layer 60), the channel layer 70 still has a very high activation efficiency with respect to the impurity atoms. Meanwhile, because the buffer layer 60 originates from the II-VI families of the periodic table, the impurity atoms are actually not considered dopants with respect to the buffer layer 60. As an example, in one embodiment, the channel layer 70 includes InAs, and the buffer layer 60 includes ZnSeTe, and either Se or Te is chosen as the impurity to be deposited. The Se or Te impurity has a high activation efficiency in the InAs (channel layer 70), but neither Se nor Te can be considered a dopant for ZnSeTe (buffer layer 60). Therefore, the end result is still that the step-doped regions 120-121 are only formed in the channel layer 70 and not in the buffer layer 60.

In a region where impurities are not activated as dopants or are not considered dopants at all, a free carrier (the carrier may be electrons) concentration level in that region is very low, approaching zero. Thus, based on the above discussions, if a free carrier concentration profile is taken across an interface 130 (or a junction) between the buffer layer 60 and the regions 120-121, the free carrier concentration profile will have a "step-like" shape. In other words, the free carrier concentration level is much lower in the buffer layer 60 side of the interface 130 than the in regions 120-121 side of the interface 130. The change in the free carrier concentration level across the interface is abrupt and sharp. Expressed differently, the free electron concentration profile follows the abruptness of the structural change including the abrupt change of dopant activation and the positive band offset from the channel layer 70 to the buffer layer 60, thus resembling a step function across the interface 130. A example graph of the step-function-like free carrier concentration profile change is shown later in FIG. 15.

Referring now to FIG. 3, gate spacers 140-141 are formed on the sidewalls of either side (or opposite sides) of the gate structure 80. The gate spacers 140-141 are formed using a deposition process and an etching process (for example, an anisotropic etching process) known in the art. The gate spacers 140-141 include a suitable dielectric material such as silicon nitride, silicon oxide, silicon oxy-nitride, or combinations thereof. The gate spacers 140-141 may be considered parts of the gate structure 80.

Next, Ohmic contacts 150-151 are formed on the regions 120-121. The Ohmic contacts 150-151 are formed by a deposition process followed by a patterning process known in the art. The Ohmic contacts 150-151 each include a metal material, for example, Mo. The Ohmic contacts 150-151 help establish electrical connections between external devices and the regions 120-121, which serve as source/drain regions of the semiconductor device 40A. The portion of the channel layer 70 beneath the gate structure 80 serves as the conductive channel region when the semiconductor device 40A is in operation. The buffer layer 60 provides positive band offsets to the channel layer 70 (including the regions 120-121) for carrier confinement.

Figure 4:
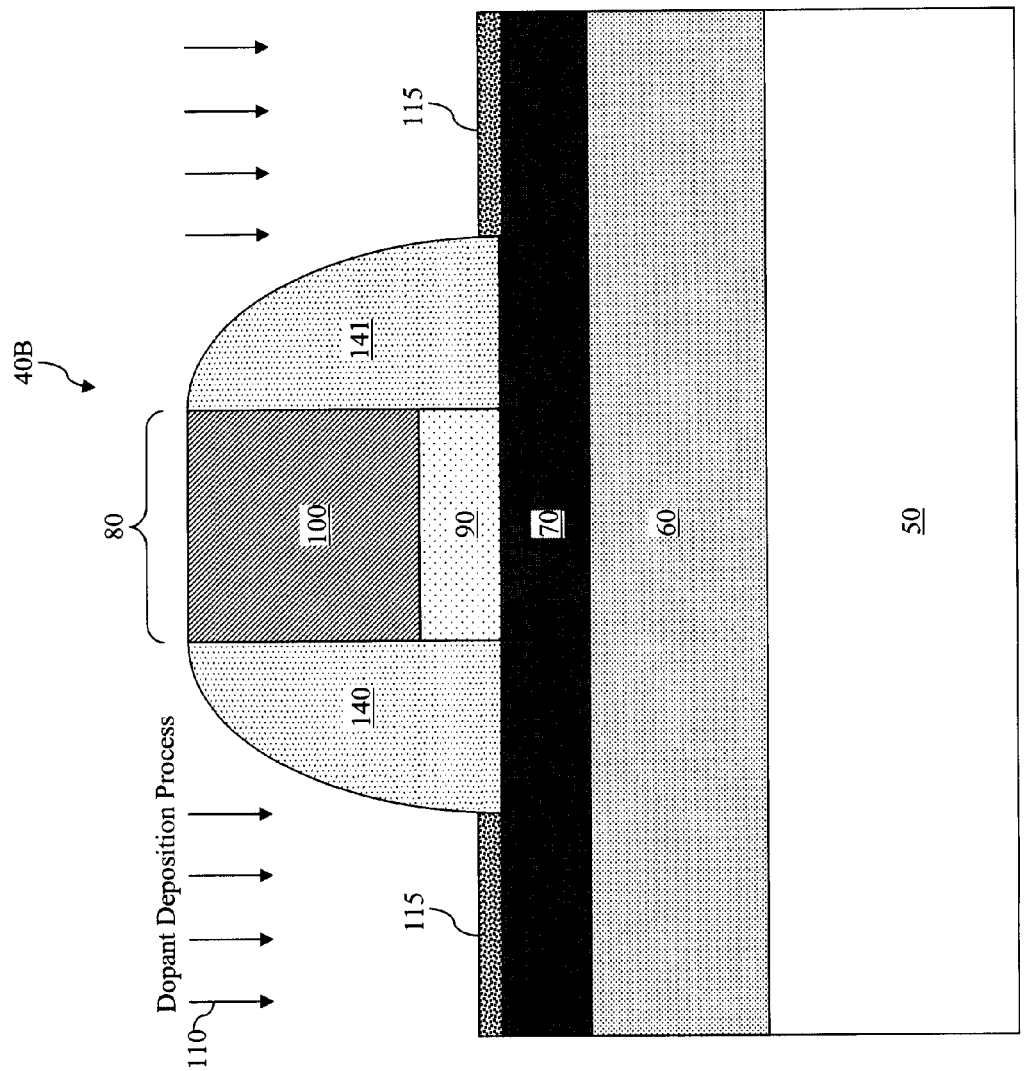
FIGS. 4-6 are diagrammatic fragmentary cross-sectional side views of a portion of a compound semiconductor device fabricated according to another embodiment of the present disclosure.
Figure 5:
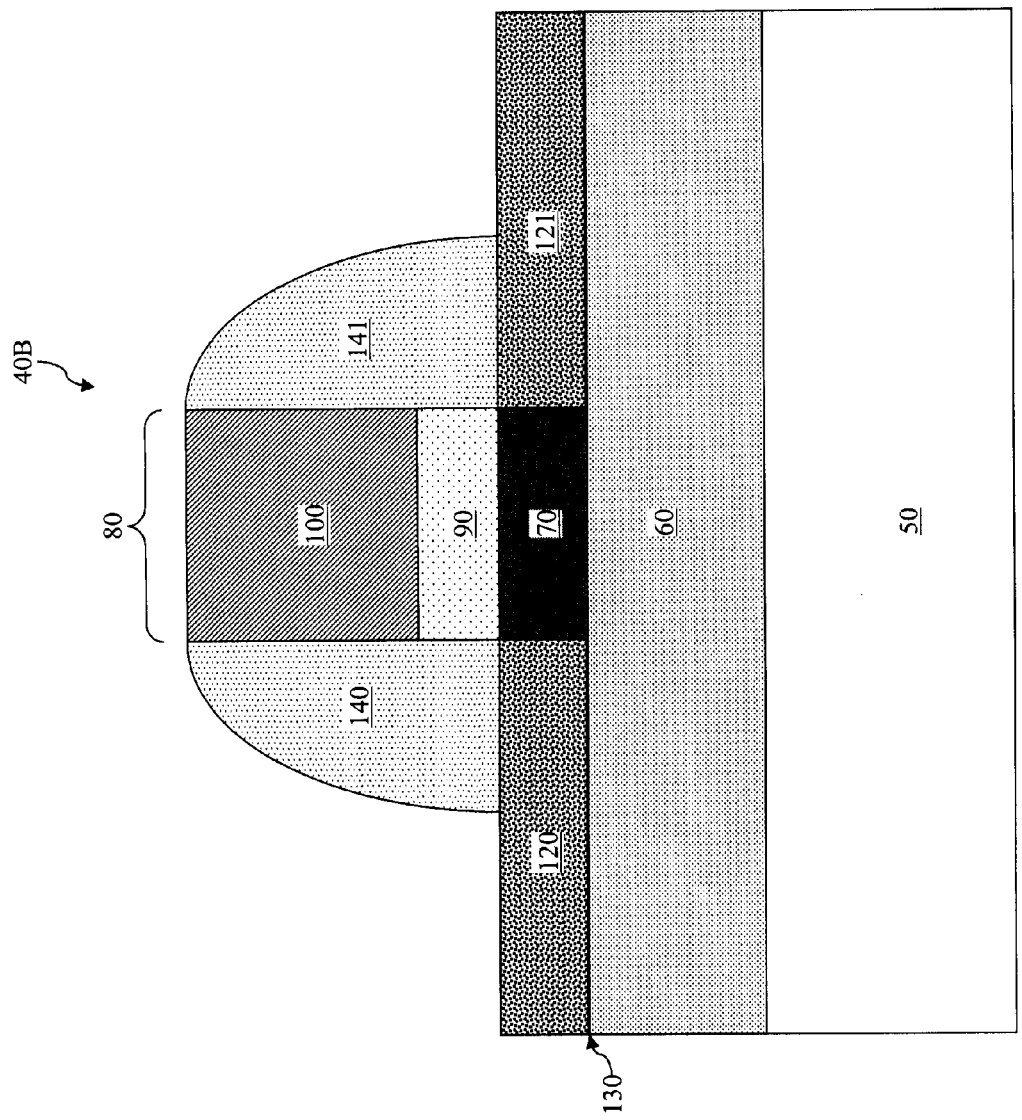
Figure 6:
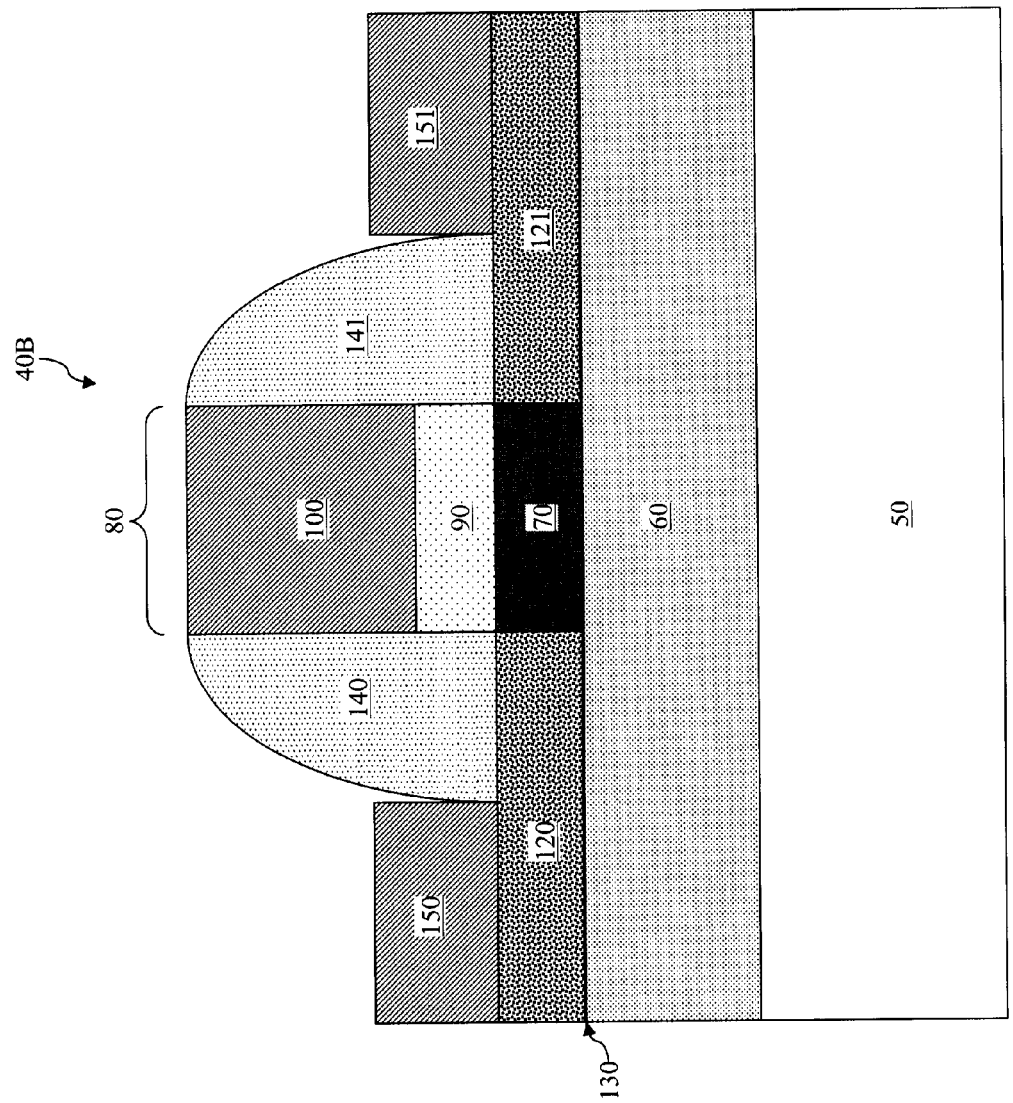

FIGS. 4-6 are diagrammatic fragmentary cross-sectional side views of a portion of a compound semiconductor device 40B fabricated according to another embodiment of the present disclosure. FIGS. 4-6 have been simplified for a better understanding of the inventive concepts of the present disclosure. Also, for the sake of consistency and clarity, similar components in FIGS. 1-3 are labeled the same in FIGS. 4-6.

Referring to FIG. 4, the buffer layer 60 is formed over the substrate 50, and the channel layer 70 is formed over the buffer layer 60. The gate structure 80 including the gate dielectric layer 90 and the gate electrode layer 100 is also formed over the channel layer 70. Thereafter, before any dopant deposition process is performed, the gate spacers 140-141 are formed on the sidewalls of the gate structure 80. The dopant deposition process 110 is performed on the semiconductor device 40B. The dopant deposition process 110 deposits the dopant layer 115 (which contains impurity atoms) on regions of the channel layer 70 on either side of the gate structure 80.

Referring to FIG. 5, an annealing process is performed to diffuse and activate the deposited impurities of the dopant layer 115. For reasons discussed above, the channel layer 70 has much higher dopant activation efficiency than the buffer layer 60. Therefore, the step-doped regions 120-121 are formed in the channel layer 70 on either side of the gate structure 80. The step-doped regions 120-121 extend underneath the gate spacers 140-141. The free carrier concentration has an abrupt change in profile across the interface 130 between the buffer layer 60 and the regions 120-121.

Referring now to FIG. 6, Ohmic contacts 150-151 are formed over the regions 120-121, respectively, next to the gate spacers 140-141. The regions 120-121 serve as the source/drain regions of the semiconductor device 40B.

Figure 7:
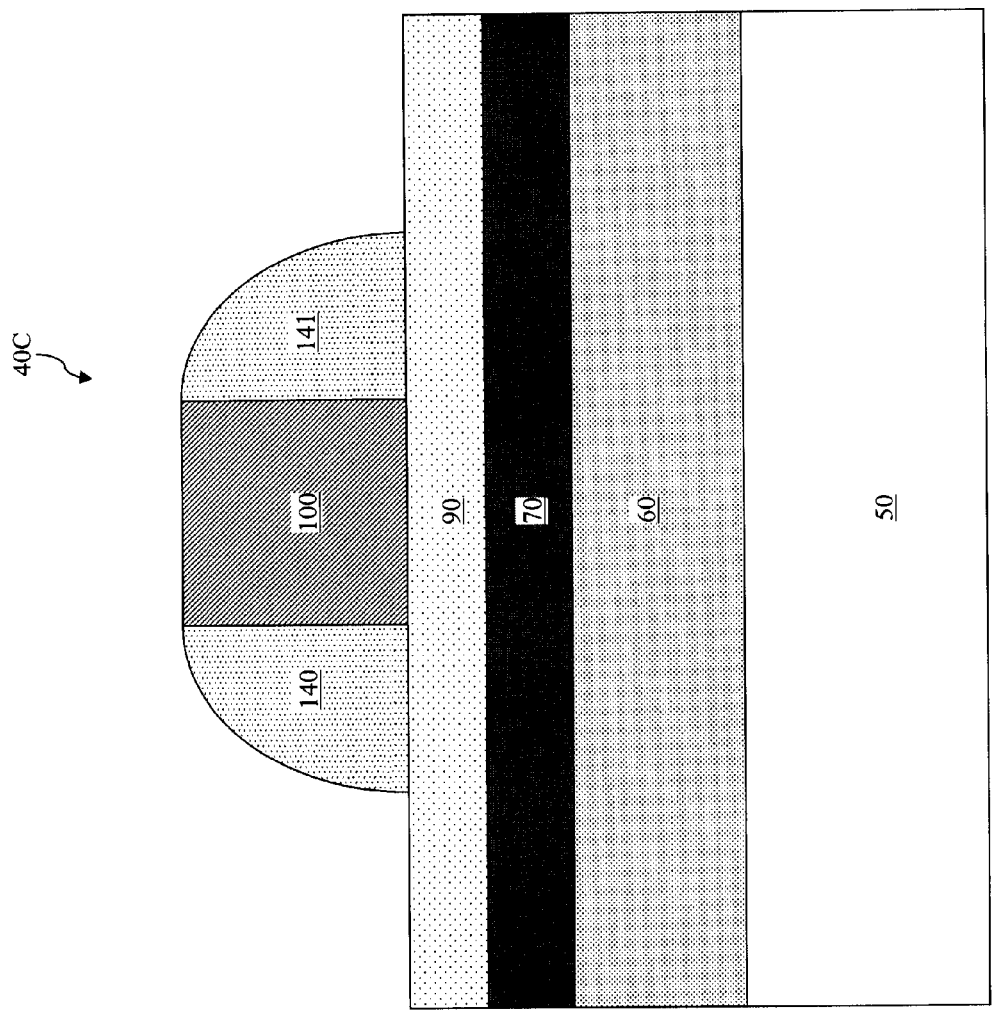
FIGS. 7-9 are diagrammatic fragmentary cross-sectional side views of a portion of a compound semiconductor device fabricated according to yet another embodiment of the present disclosure.
Figure 8:
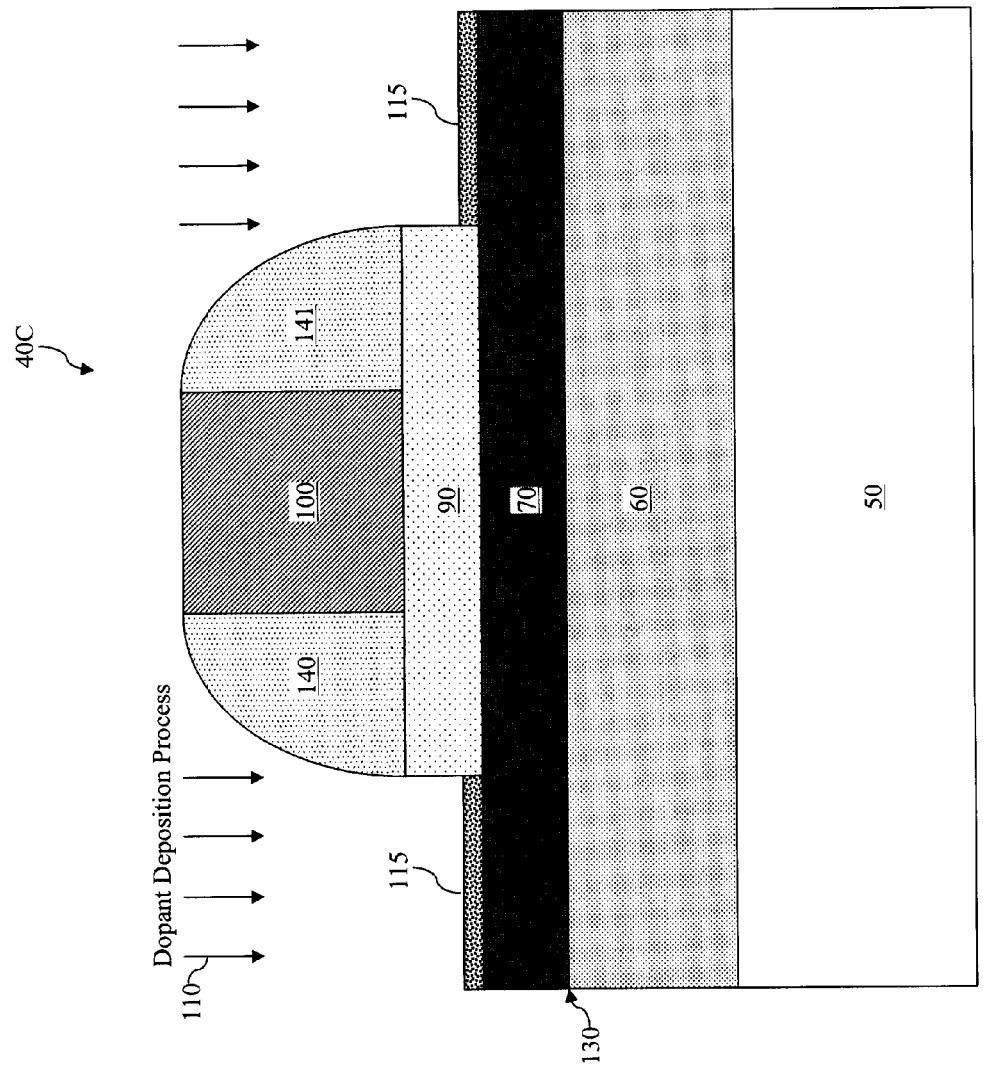
Figure 9:
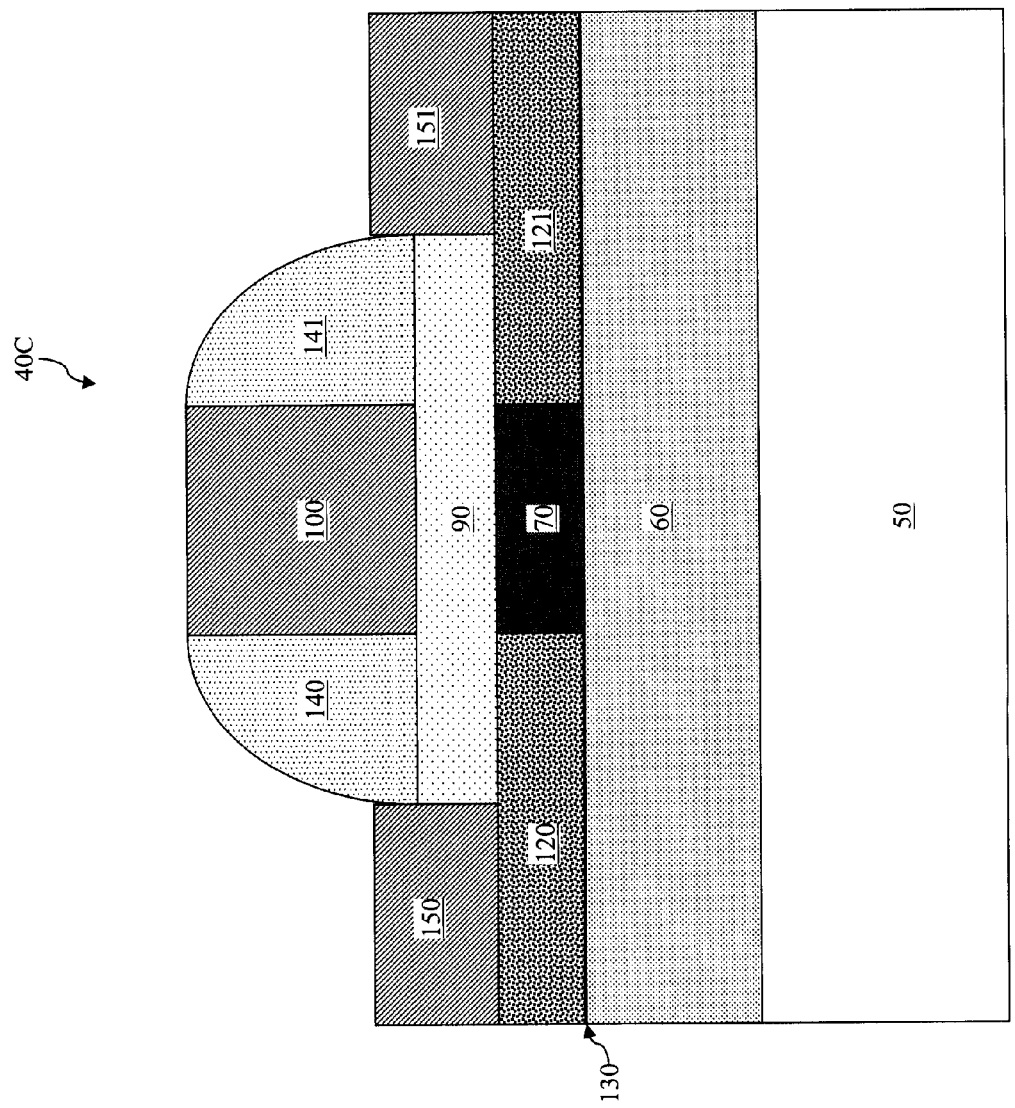

FIGS. 7-9 are diagrammatic fragmentary cross-sectional side views of a portion of a compound semiconductor device 40C fabricated according to another embodiment of the present disclosure. FIGS. 7-9 have been simplified for a better understanding of the inventive concepts of the present disclosure. Also, for the sake of consistency and clarity, similar components in FIGS. 1-3 are labeled the same in FIGS. 7-9.

Referring to FIG. 7, the buffer layer 60 is formed over the substrate 50, and the channel layer 70 is formed over the buffer layer 60. A gate dielectric layer 90 is formed over the channel layer 70. Thereafter, a patterned gate electrode layer 100 is formed over the gate dielectric layer 90. Gate spacers 140-141 are formed on the sidewalls of the gate electrode layer 100 on either side.

Referring now to FIG. 8, the gate dielectric layer 90 is patterned using the gate electrode layer 100 and the gate spacers 140-141 above as protective layers. Thereafter, the dopant deposition process 110 is performed to the semiconductor device 40C to deposit the dopant layer 115 containing impurities on the regions of the channel layer 70 on either side of the gate dielectric 90.

Referring now to FIG. 9, the semiconductor device 40C is annealed to diffuse and activate the deposited impurities in the channel layer 70. As a result, step-doped regions 120-121 are formed in the channel layer 70 but not in the buffer layer 60. Once again, an abrupt free carrier concentration profile exists across the interface 130 between the buffer layer 60 and the regions 120-121. Ohmic contacts 150-151 are then formed over the regions 120-121, respectively, next to the gate spacers 140-141. The regions 120-121 serve as the source/drain regions of the semiconductor device 40C.

The various embodiments discussed above with reference to FIGS. 6-9 are performed according to a gate-first process flow. The followings FIGS. 10-14 illustrate diagrammatic fragmentary cross-sectional side views of a semiconductor device 40D, which is fabricated according to a gate-last process flow (also referred to as a replacement gate process flow).

Figure 10:
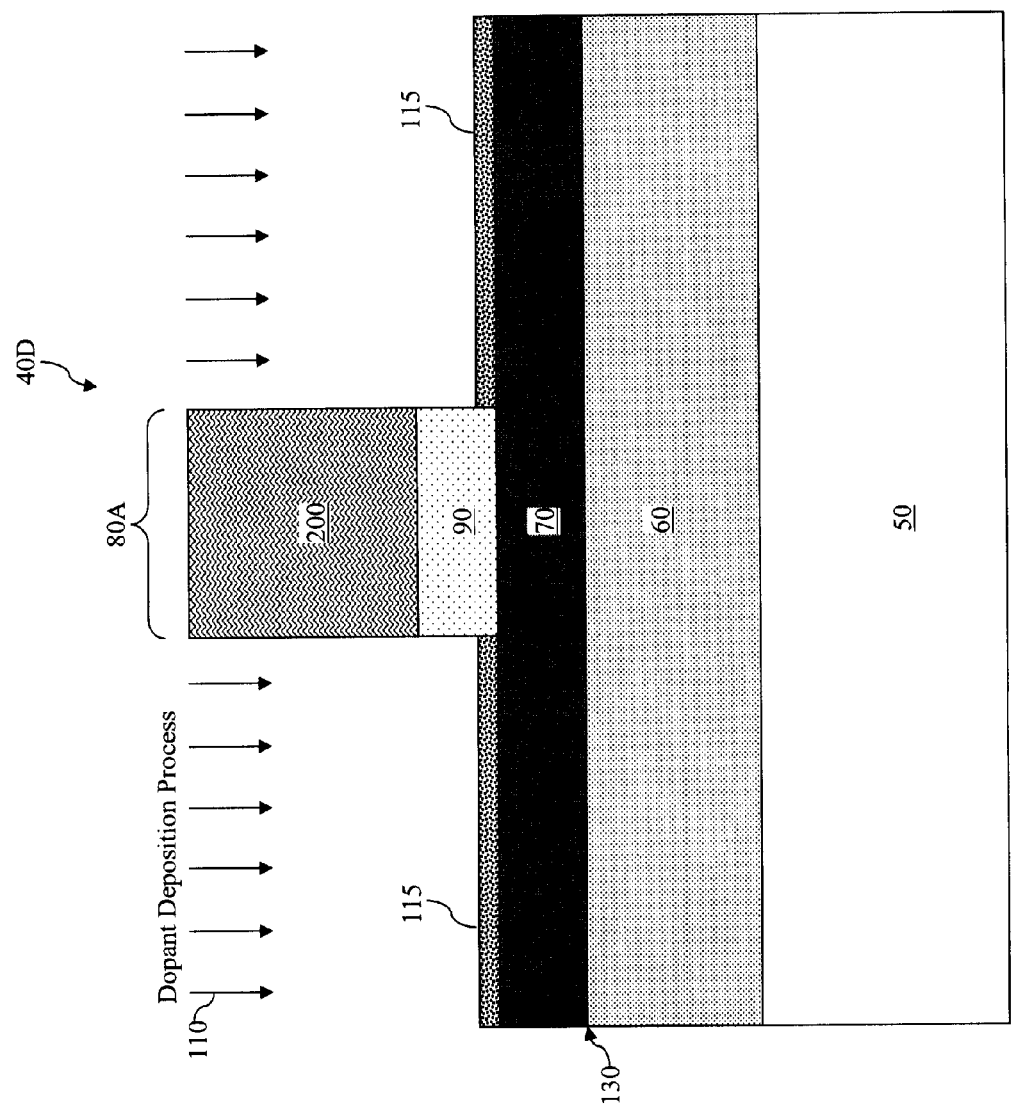
FIGS. 10-14 are diagrammatic fragmentary cross-sectional side views of a portion of a compound semiconductor device fabricated according to one more embodiment of the present disclosure.

Referring to FIG. 10, the buffer layer 60 is formed over the substrate 50, and the channel layer 70 is formed over the buffer layer 60. The gate dielectric layer 90 containing a high-k dielectric material is formed over the channel layer 70. Thereafter, a dummy gate electrode layer 200 is formed over the gate dielectric layer 90. In one embodiment, the dummy gate electrode layer 200 includes a polysilicon material. This dummy gate electrode layer 200 will be replaced later. The dummy gate electrode layer 200 and the gate dielectric layer 90 together form a gate structure 80A.

Next, the dopant deposition process 110 is performed on the semiconductor device 40D. The dopant deposition process 110 deposits the dopant layer 115 containing impurities on regions of the channel layer 70 on either side of the gate structure 80A.

Figure 11:
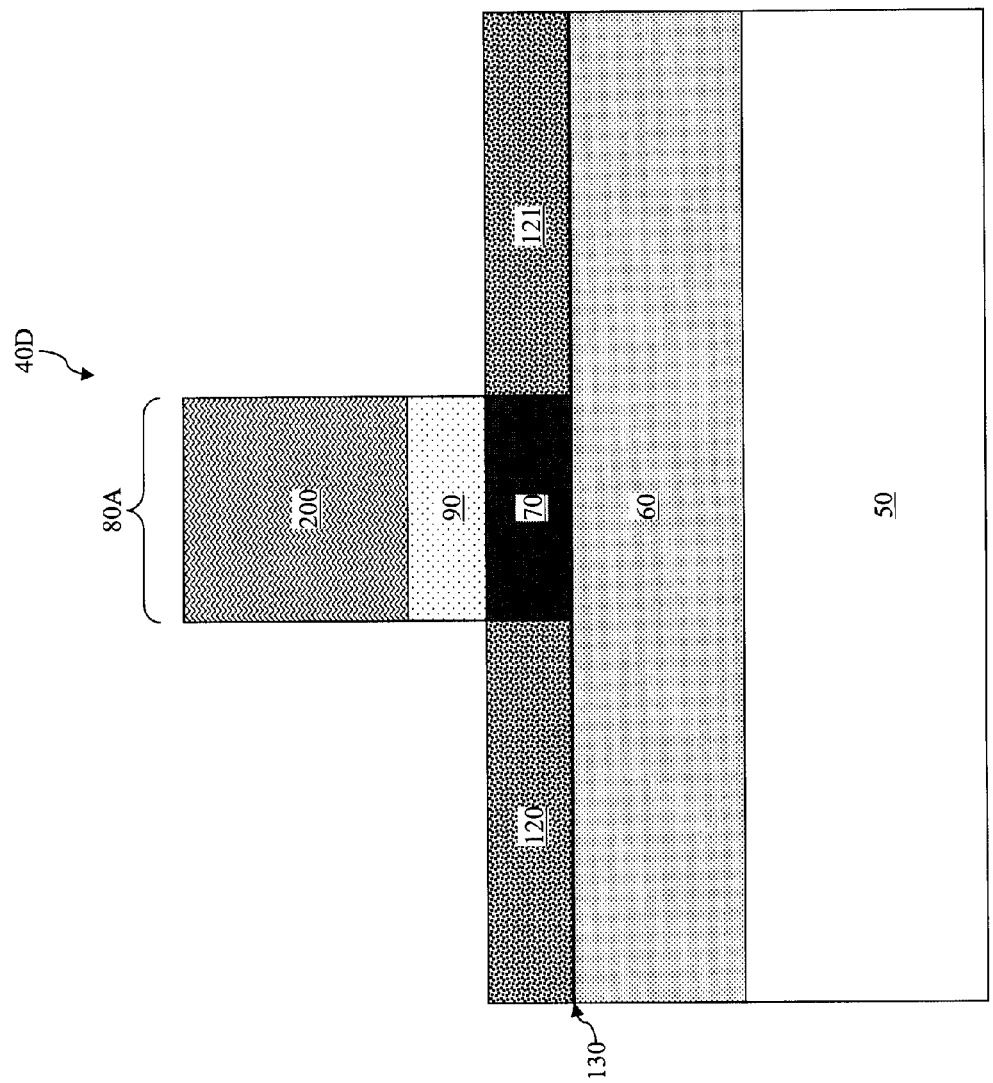

Referring to FIG. 11, an annealing process is performed to diffuse and activate the deposited impurities. Due to the difference between their respective dopant activation efficiencies of the channel layer 70 and the buffer layer 60, the step-doped regions 120-121 are formed in the channel layer 70 on either side of the gate structure 80A. An abrupt free carrier concentration profile exists across the interface 130 between the buffer layer 60 and the regions 120-121.

Figure 12:
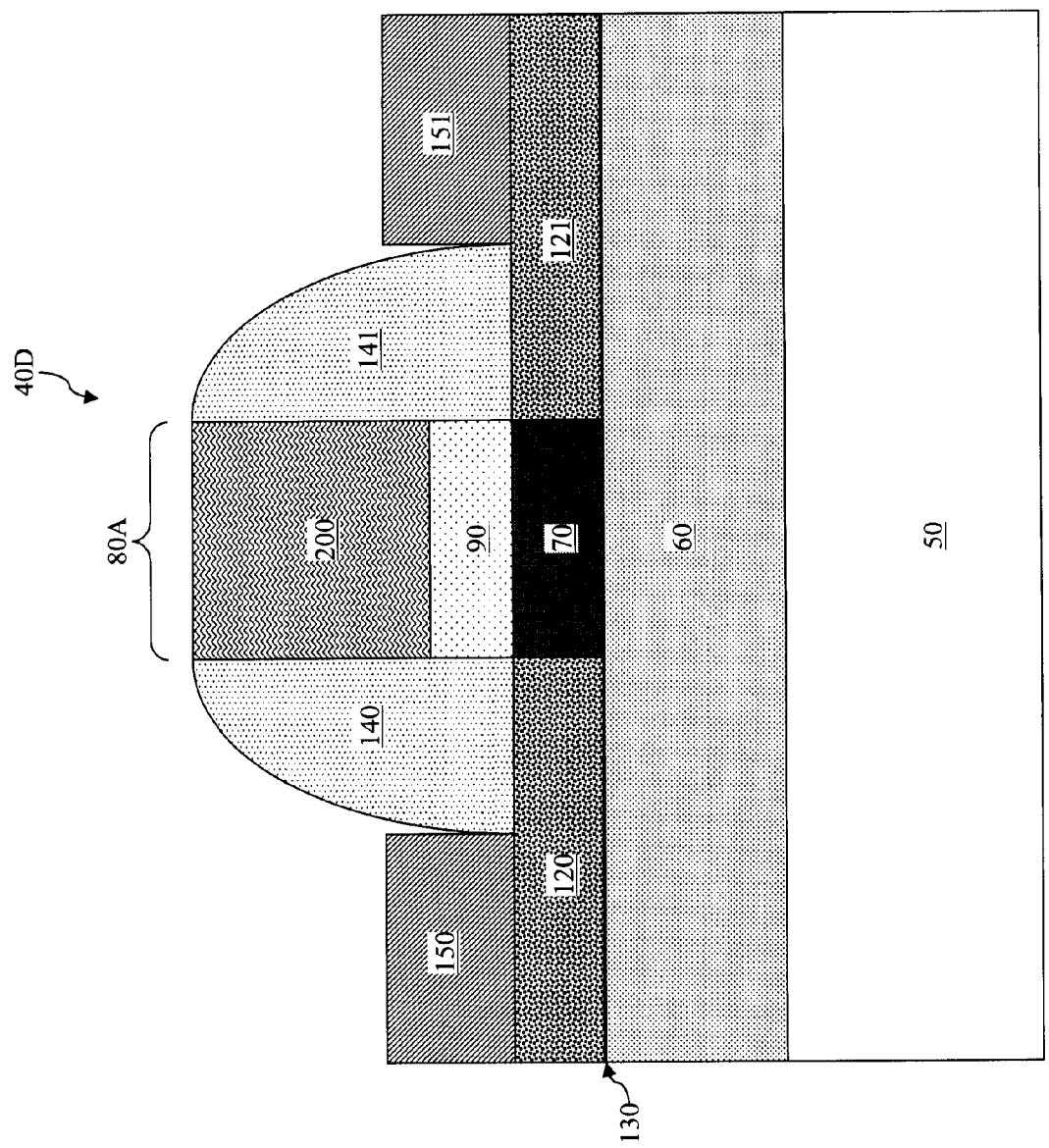

Referring now to FIG. 12, gate spacers 140-141 are formed on either side of the gate structure 80A. Ohmic contacts 150-151 are then formed on the regions 120-121, respectively.

Figure 13:
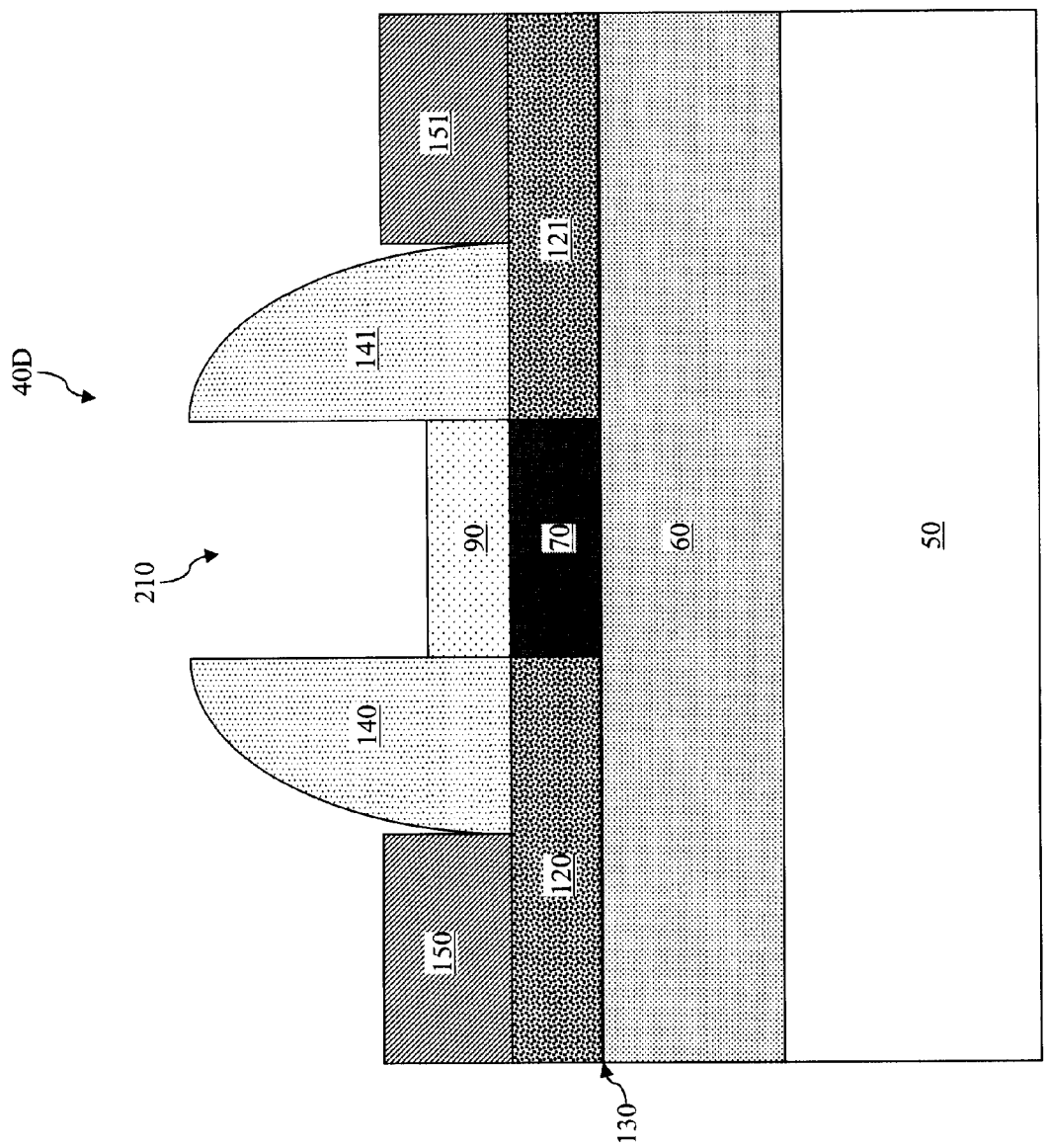

Referring now to FIG. 13, the dummy gate electrode layer 200 is removed, thus creating an opening or a trench 210 in place of the dummy gate electrode layer 200.

Figure 14:
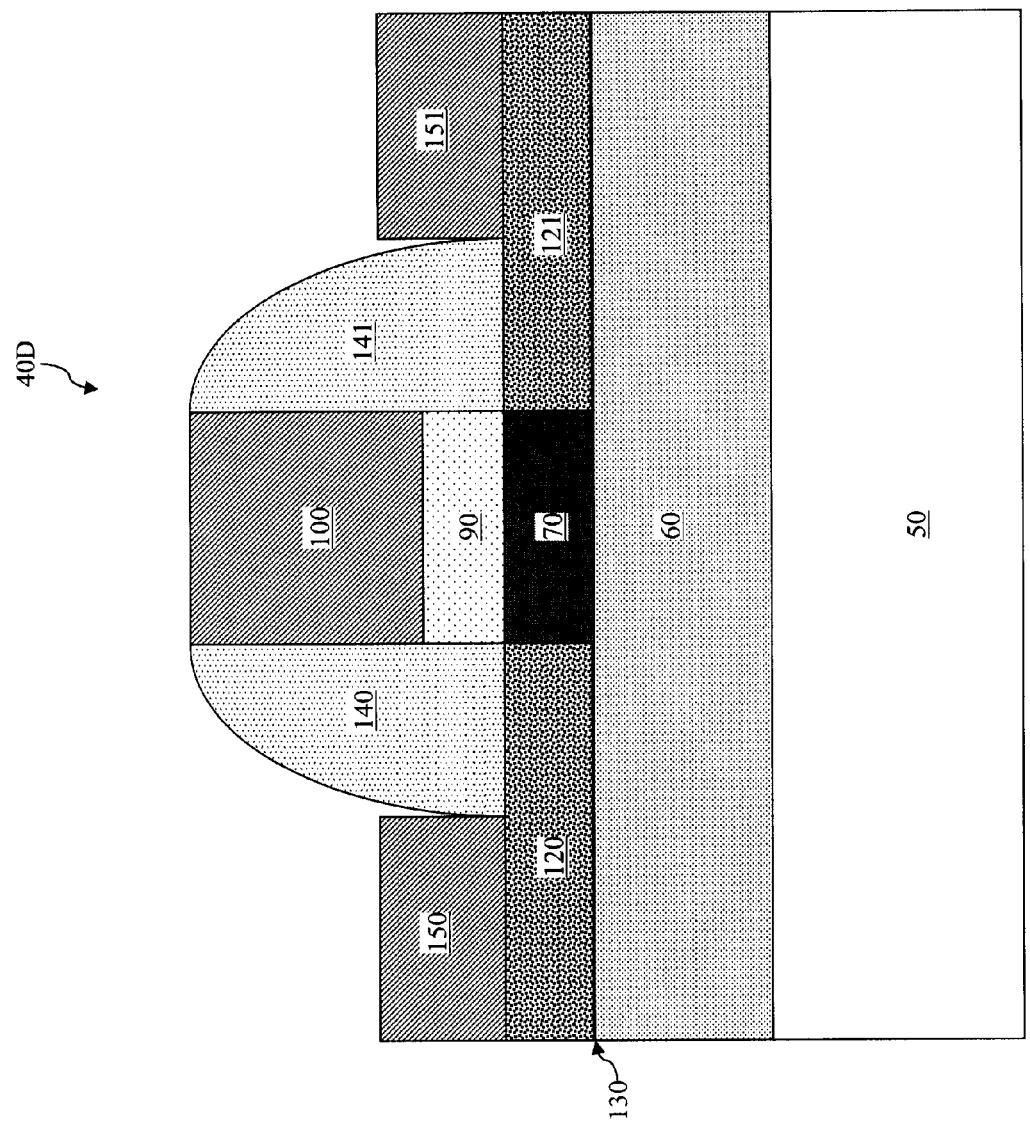

Referring now to FIG. 14, the gate electrode layer 100 that contains the metal material is formed to fill the opening or trench 210. It is also understood that in an alternative embodiment of the gate-last process, a dummy gate dielectric layer may be formed in place of the high-k gate dielectric layer 90. In that case, the dummy gate dielectric layer may contain a silicon oxide material, and the dummy gate dielectric layer is removed along with the dummy gate electrode layer 200, thereby creating the opening/trench. The high-k gate dielectric layer 90 is then formed in the opening/trench, and then the metal gate electrode layer 100 is then formed over the high-k gate dielectric layer 90. This alternative process flow is referred to as a high-k last process flow.

Figure 15:
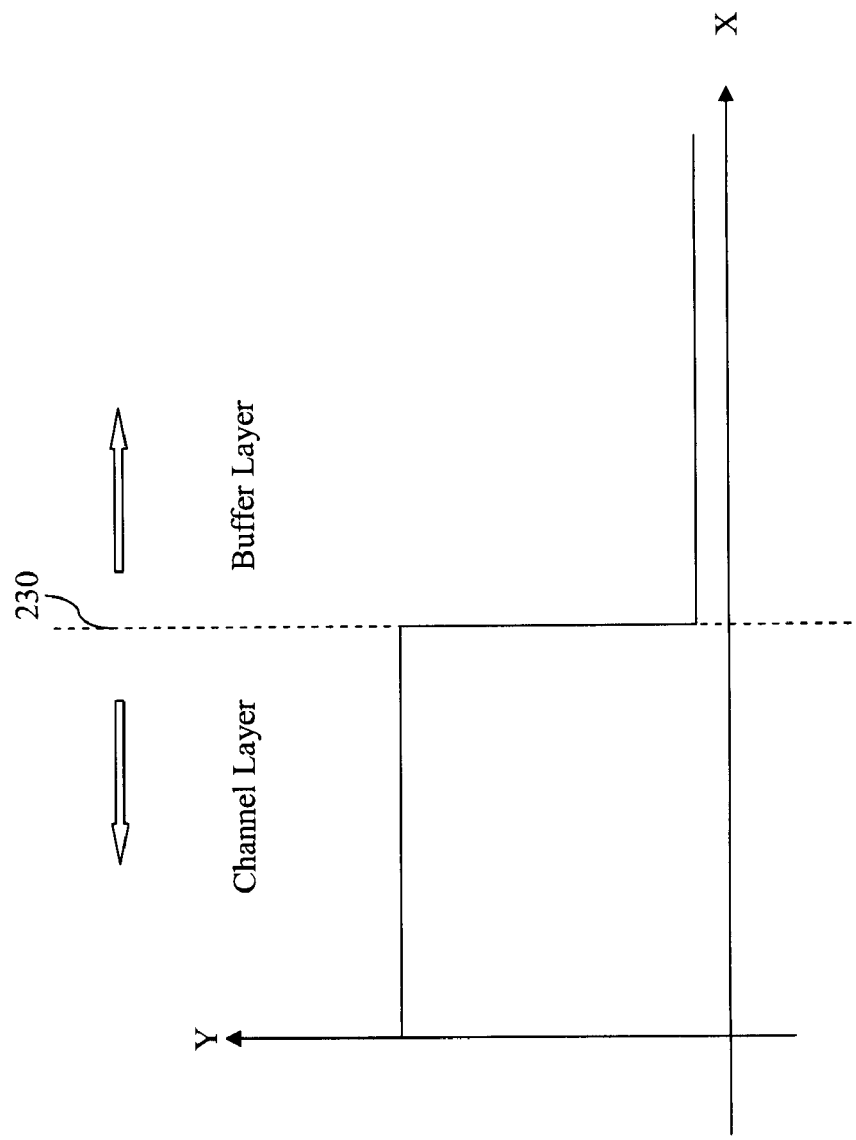
FIG. 15 is a graph illustrating free carrier concentration level as a function of depth inside the extensions of a compound semiconductor device.

FIG. 15 is a graph illustrating the free carrier concentration profile across the buffer layer 60 and the channel layer 70 inside the extensions (specifically, regions 120-121 of the channel layer 70) after the dopant activation process has been performed. The X-axis of the graph represents the depth positions inside the semiconductor device. A vertical line 230 designates the interface 130 between the buffer layer 60 and the channel layer 70. As shown in the graph, left of the line 230 is considered the channel layer 70, and right of the line 230 is considered the buffer layer 60. The Y-axis represents the free carrier concentration level. As discussed above, the free carrier concentration level drops abruptly at the line 230 (the interface 130 between the buffer layer 60 and the channel layer 70). This is due to the drastic differences between dopant activation efficiencies inside the buffer layer 60 and the channel layer 70 and the positive band offset of buffer layer 60 with respect to channel layer 70. The channel layer 70 has a high dopant activation efficiency, while the buffer layer 60 has a dopant activation efficiency close to zero, or the deposited impurities are not considered a dopant at all inside the buffer layer 60. Thus, the free carrier concentration level inside the buffer layer 60 is much lower (and approaches zero) than inside the channel layer 70. The abrupt change in free carrier concentration level tracks the abrupt material change of the channel layer/buffer layer structure.

Figure 16:
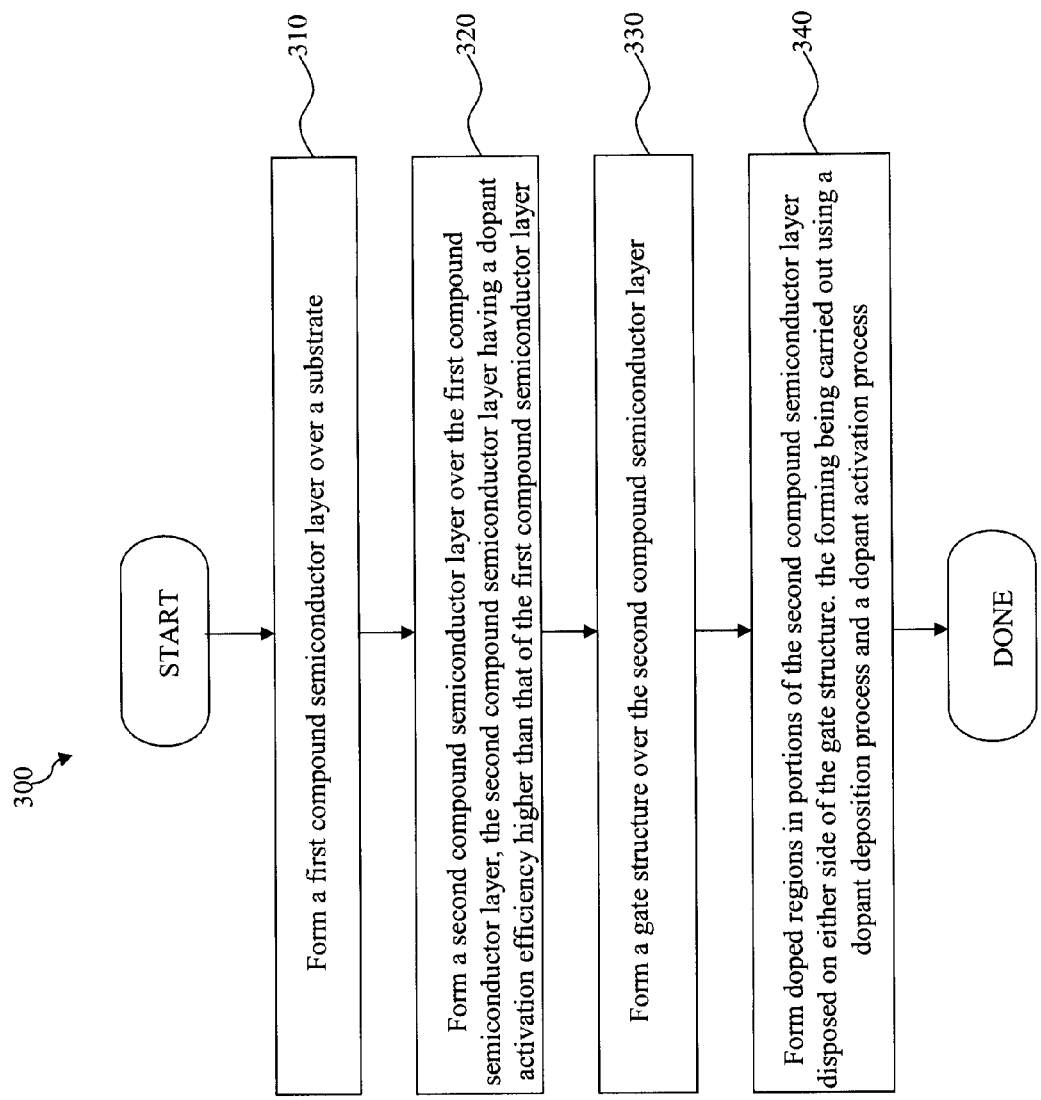
FIG. 16 is a flowchart illustrating a method of fabricating a compound semiconductor device according to various aspects of the present disclosure.

FIG. 16 is a flowchart illustrating a method 300 of fabricating a compound semiconductor device according to various aspects of the present disclosure. The method 300 begins with block 310 in which a first compound semiconductor layer is formed over a substrate. The method 300 continues with block 320 in which a second compound semiconductor layer is formed over the first compound semiconductor layer. The second compound semiconductor layer has a dopant activation efficiency higher than that of the first compound semiconductor layer. The method 300 continues with block 330 in which a gate structure is formed over the second compound semiconductor layer. The method 300 continues with block 340 in which doped regions are formed in portions of the second compound semiconductor layer disposed on either side of the gate structure. The forming of the doped regions is carried out using a dopant deposition process and a dopant diffusion/activation process.

The gate-first and the gate-last embodiments discussed above with reference to FIGS. 1-16 offer advantages over existing techniques of fabricating compound semiconductor devices. It is understood, however, that other embodiments may offer different advantages, and that no particular advantage is required for any one embodiment. One advantage is that the embodiments discussed above allow for control of the free carrier concentration profiles. As discussed above, by choosing the material compositions of the buffer layer 60, the channel layer 70, and the dopant impurities, step-doped regions 120-121 may be formed in the channel layer 70. The depth or thickness of the channel layer 70 determines the depth or thickness of the step-doped regions 120-121. The step-doped regions 120-121 are not formed in the buffer layer 60 because the channel layer 70 has a much higher dopant activation efficiency with respect to the impurity than the buffer layer 60. The buffer layer 60 either has a dopant activation efficiency that is effectively zero, or the impurity is not considered a dopant at all to the buffer layer 60. Consequently, almost no impurities will be activated in the buffer layer 60, thereby creating the abrupt change in free concentration profile across the interface 130 between the buffer layer 60 and the step-doped regions 120-121. In comparison, it may be difficult for traditional methods to achieve the abrupt profile change in free carrier concentration. It may also be difficult for traditional methods to control the depth of the doped regions.

Another advantage is that the step-doped regions 120-121 (serving as source/drain regions) and the conductive channel 70 below the gate 80 are formed in a single layer. In some traditional methods, the source/drain regions and the channel region are formed with different layers or different components, even if these layers/components contain substantially identical materials. In those situations, defects may exist along the interface between the channel region and the source/drain regions, which degrade device performance. In comparison, according to the present disclosure, the step-doped regions 120-121 and the channel layer 70 below the gate are never physically separated or divided. Rather, portions of the channel layer 70 not protected by the gate 80 are doped to form the step-doped regions 120-121, and as such still belong to the same layer as the channel layer 70 below the gate 80. Therefore, the interfaces between the step-doped regions 120-121 and the channel layer 70 below the gate 80 are substantially defect-free. Alternatively stated, the edge regions of the step-doped regions 120-121 are substantially defect-free, since the channel layer 70 has never been physically separated or divided.

Furthermore, the existing techniques of fabricating compound semiconductor devices may require highly complicated processes that drive up fabrication costs and lengthen processing time. In comparison, the methods disclosed in the embodiments herein are simple and easy to implement, and are otherwise compatible with existing process flow.

In the embodiment where the channel layer 70 and the buffer layer 60 originate from materials belonging to different families of the periodic table (III-V families for the channel layer 70, and II-VI families for the buffer layer 60), a sufficiently high valence band offset $\Delta E_v$ is created as a result. For example, the $\Delta E_v$ may be as high as 0.38 electron-volts. Thus, that embodiment offers an additional benefit of providing efficient confinement of holes within the channel layer 70.

One of the broader forms of the present disclosure involves a method. The method includes forming first compound semiconductor layer over a substrate. The method includes forming a second compound semiconductor layer over the first compound semiconductor layer. The second compound semiconductor layer has a dopant activation efficiency higher than that of the first compound semiconductor layer. The method includes forming a gate structure over the second compound semiconductor layer. The method includes forming doped regions in portions of the second compound semiconductor layer disposed on either side of the gate structure. The forming is carried out using an dopant deposition process and a dopant diffusion/activation process.

Another one of the broader forms of the present disclosure involves a method. The method includes forming a buffer layer over a substrate, the buffer layer containing a first compound semiconductor that includes elements from one of: III-V families of a periodic table; and II-VI families of the periodic table. The method includes forming a channel layer over the buffer layer. The channel layer contains a second compound semiconductor that includes elements from the III-V families of the periodic table. The method includes forming a gate over the channel layer. The method includes depositing impurities on regions of the channel layer on either side of the gate. The method includes performing an annealing process to diffuse the impurities in the channel layer.

Yet one more of the broader forms of the present disclosure involves a semiconductor device. The semiconductor device includes a substrate. The semiconductor device includes a first compound semiconductor layer formed over the substrate. The semiconductor device includes a second compound semiconductor layer formed over the first compound semiconductor layer. The second compound semiconductor layer has a dopant activation efficiency higher than that of the first compound semiconductor layer. The semiconductor device includes a gate structure formed over the second compound semiconductor layer. Regions of the second compound semiconductor layer disposed on either side of the gate structure are doped with impurities.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate;
   a first compound semiconductor layer formed over the substrate;
   a second compound semiconductor layer formed over the first compound semiconductor layer, the second compound semiconductor layer having a compound composition different from that of the first compound semiconductor layer and having a dopant activation efficiency higher than that of the first compound semiconductor layer; and
   a gate structure formed over the second compound semiconductor layer;
   wherein regions of the second compound semiconductor layer disposed on either side of the gate structure have impurities, and wherein a free carrier concentration profile abruptly changes across an interface between the first and second compound semiconductor layers.

2. The semiconductor device of claim 1, wherein:
   the first compound semiconductor layer includes elements from two families of a periodic table, the two families being selected from the group consisting of: II-VI families and III-V families; and
   the second compound semiconductor layer includes elements from III-V families of the periodic table.

3. The semiconductor device of claim 1, wherein:
   the first compound semiconductor layer includes a material selected from the group consisting of: AlSb, GaSb, AlAsSb, AlGaSb, AlInSb, InP, ZnTe, ZnSe, CdSe, CdS, CdTe, ZnSeTe, CdSeTe, and CdSSe;
   the second compound semiconductor layer includes a material selected from the group consisting of InAs, GaSb, InGaAs, InGaSb, and InAsSb; and
   the impurities include a material selected from the group consisting of: Si, Te, S, and Se.

4. The semiconductor device of claim 1, wherein the first compound semiconductor layer has positive band offsets in both the conduction and the valence band with respect to the second semiconductor layer.

5. The semiconductor device of claim 1, wherein the first compound semiconductor layer has positive conduction band offsets with respect to the second semiconductor layer; and wherein the impurities are of a donor type.

6. The semiconductor device of claim 1, wherein the first compound semiconductor layer has positive valence band offsets with respect to the second semiconductor layer; and wherein the impurities are of an acceptor type.

7. A method, comprising:
   forming a first compound semiconductor layer over a substrate;
   forming a second compound semiconductor layer over the first compound semiconductor layer, the second compound semiconductor layer having a compound composition different from that of the first compound semiconductor layer and having a dopant activation efficiency higher than that of the first compound semiconductor layer;
   forming a gate structure over the second compound semiconductor layer; and
   forming doped regions in portions of the second compound semiconductor layer disposed on either side of the gate structure, the forming the doped regions comprising a dopant deposition process and a dopant activation process;
   wherein the forming the first compound semiconductor layer, the forming the second compound semiconductor layer, and the forming the doped regions are carried out in a manner so that a free carrier concentration profile abruptly changes across an interface between the first and second compound semiconductor layers.

8. The method of claim 7, wherein:
   the dopant deposition process deposits impurities on portions of the second compound semiconductor layer on either side of the gate structure; and
   the dopant activation process activates the deposited impurities in the second compound semiconductor layer.

9. The method of claim 8, wherein the impurities are selected from the group consisting of: Si, Te, S, and Se.

10. The method of claim 8, wherein the forming the first compound semiconductor layer and the forming the doped regions are carried out in a manner so that the first compound semiconductor layer has an activation efficiency close to zero with respect to the impurities.

11. The method of claim 7, wherein the forming the first compound semiconductor layer and the forming the second compound semiconductor layer are carried out in a manner so that:
   the first compound semiconductor layer includes elements from II and VI families of a periodic table; and
   the second compound semiconductor layer includes elements from III and V families of the periodic table.

12. The method of claim 7, wherein the forming the first compound semiconductor layer and the forming the second compound semiconductor layer are carried out in a manner so that:
   the first compound semiconductor layer includes elements from III and V families of a periodic table; and
   the second compound semiconductor layer includes elements from III and V families of the periodic table.

13. The method of claim 7, wherein the forming the gate structure is carried out in a manner so that the gate structure includes a high-k gate dielectric and a metal gate electrode.

14. The method of claim 7, wherein the forming the gate structure is carried out in a manner so that the gate structure includes a dummy gate electrode; and further comprising, after the forming the doped regions, replacing the dummy gate electrode with a metal gate electrode.

15. A method, comprising:
   forming a buffer layer over a substrate, the buffer layer containing a first compound semiconductor that includes elements from one of: III-V families of a periodic table, and II-VI families of the periodic table;
   forming a channel layer over the buffer layer, the channel layer containing a second compound semiconductor that includes elements from the III-V families of the periodic table, wherein the buffer layer and the channel layer have different compound compositions;
   forming a gate over the channel layer;
   depositing impurities on regions of the channel layer on either side of the gate; and
   performing an annealing process to diffuse the impurities in the channel layer;
   wherein forming the buffer layer, the forming the channel layer, and the depositing are carried out in a manner so that a heterojunction between the buffer layer and the channel layer has a free carrier concentration profile that resembles a step function.

16. The method of claim 15, wherein forming the buffer layer, the forming the channel layer, and the depositing are carried out in a manner so that the impurities have greater activation efficiencies in the channel layer than in the buffer layer.

17. The method of claim 15, wherein:
the depositing is carried out in a manner so that the impurities include a material selected from the group consisting of: Si, Te, S, and Se;
the forming the buffer layer is carried out in a manner so that the buffer layer includes a material selected from the group consisting of: AlSb, GaSb, AlAsSb, AlGaSb, AlInSb, InP, ZnTe, ZnSe, CdSe, CdS, CdTe, ZnSeTe, CdSeTe, and CdSSe; and
the forming the channel layer is carried out in a manner so that the channel layer includes a material selected from the group consisting of: InAs, GaSb, InGaAs, InGaSb, and InAsSb.

18. The method of claim 15, wherein the forming the gate is carried out in a manner so that the gate includes a polysilicon gate electrode; and further including, after the performing the annealing process, removing the polysilicon gate electrode, and thereafter forming a metal gate electrode in place of the polysilicon gate electrode.

* * * * *